United States Patent [19]
Takagi et al.

[11] Patent Number: 6,156,385
[45] Date of Patent: Dec. 5, 2000

[54] PROCESS FOR PARTIAL ELECTROLESS PLATING

[75] Inventors: Kaneyuki Takagi, 8-8, Nishi-ochial 1-chome, Shinjuku-ku, Tokyo; Kazuya Sato, Katano, both of Japan

[73] Assignee: Kaneyuki Takagi, Tokyo, Japan

[21] Appl. No.: 09/330,082

[22] Filed: Jun. 11, 1999

[30] Foreign Application Priority Data

Jun. 15, 1998 [JP] Japan ................... 10-167028

[51] Int. Cl.$^7$ ..................... B05D 3/10
[52] U.S. Cl. ............ 427/306; 427/305; 427/261; 427/265; 427/404; 427/412.1; 427/443.1
[58] Field of Search ................... 427/304, 306, 427/443.1, 261, 305, 437, 438, 265, 412.1, 404

[56] References Cited

U.S. PATENT DOCUMENTS 3,589,916 6/1971 McCormack ................... 106/1
4,842,946 6/1989 Foust et al. ................... 427/306

Primary Examiner—Shrive Beck
Assistant Examiner—Kirsten A. Crockford
Attorney, Agent, or Firm—Armstrong, Westerman, Hattori, McLeland & Naughton

[57] ABSTRACT

An efficient process for partial electroless plating that causes plating film to deposit only a specific part of substrate which needs plating, without requiring the corrosion step. The process includes five steps of forming a coating film on which electroless plating is performed, activating said coating film, imparting a catalyst to said coating film, activating said catalyst, and performing electroless plating, and said coating film is formed from any one of the following four resin compositions:

1. composed of a low-molecular weight compound having an N—H bond, an adhesive polymer having a C=C double bond, and a polybasic acid having a C=C double bond;
2. composed of an adhesive polymer dense with N—H bonds, and a polybasic acid compatible with said polymer or a monobasic acid having a C=C double bond;
3. composed of a resin component which gives rise to an N—H bond upon curing reaction, and a polybasic acid having a C=C double bond; or
4. composed of a resin component which gives rise to an N—H bond upon curing reaction, an adhesive polymer having a C=C double bond in the main chain, and a polybasic acid having a C=C double bond.

3 Claims, No Drawings

PROCESS FOR PARTIAL ELECTROLESS PLATING

BACKGROUND OF THE INVENTION

1. Field of the Invention

The present invention relates to a new process for partial electroless plating on a plastic substrate. This process requires that only the part for plating be coated with a coating compound which forms a film of resin composition with a special structure so that electroless plating film is deposited only on thus formed coating film. Hence, this process does not need any corrosion step. The present invention can be applied to any field in which electroless plating is used; however, it is advantageously applied to electromagnetic wave shielding particularly that of heat-resistant resin and printed circuit boards.

2. Description of the Related Art

Electroless plating is performed on plastic moldings which are electrically non-conductive so that they are made conductive and receptive to electroplating. It is preceded by pretreatment to corrode the surface of molding to be plated, thereby forming minute etch pits in the surface layer. In the subsequent electroless plating step, these etch pits produce the anchoring effect on metal deposited on their inside wall, so that the plated layer is bonded to the surface of the substrate. The etching step may be preceded by pretreatment such as swelling by a solvent which facilitates etching in the case of such resins as propylene and polyether imide which are difficult to etch.

A process for electroless plating on plastics, which employs an adhesive for electroless plating, is disclosed in Japanese Patent Laid-open Nos. 8281/1990 and 22081/1991. It is designed for production of printed circuit boards. The adhesive used in this process has a composition which permits corrosion more readily than the substrate. Prior to electroless plating, this adhesive is applied to the substrate and then corroded so that etch pits are formed in the surface layer of the adhesive. The resulting etch pits produce the anchoring effect for the coating film to adhere to the substrate, as mentioned above.

If electroless plating is to be performed partially on a substrate, it is necessary to apply a masking paint to the part which does not need plating. This masking paint should be resistant to corrosion and should prevent the deposition of plating film. With the masking paint partially applied, the substrate undergoes corrosion and electroless plating. The masking paint is left unremoved after electroless plating. This is a common practice in decorative plating.

The conventional technology of electromagnetic wave shielding, to which the present invention is applicable, includes coating with an electrically conducting paint, thermal spraying of zinc, and lamination or sandwich lamination with a layer of electrically conductive plastics filled with an electrically conductive material. They are not necessarily 100% effective. Although the use of an electrically conductive paint is most popular among them, it is uneconomical because the paint is expensive and it should be applied thick. Incidentally, electromagnetic wave shielding by electroless plating film has recently been fully recognized as effective; however, it is not yet widely spread because of the problems mentioned later.

Printed circuit boards are produced commonly by the subtractive process which consists of applying a photosensitive masking agent to a copper-clad substrate, projecting a reduced image of circuit diagrams to the mask, developing the mask and removing the mask except for the circuit part, thereby causing the copper foil to expose, and finally dissolving and removing the exposed copper foil. This process has the disadvantage of wasting most copper on the substrate and requiring the treatment of copper-containing waste liquid. In addition, because copper foil that can be clad is limited in thickness, this process does not meet the market need for a thinner copper layer.

New processes to obtain a thin copper layer are sputtering and electroless plating. The former is poor in productivity because of necessity for operation in a vacuum, and the latter needs a step of corrosion. An additional but less common process is the full-additive process which is designed to form circuit directly on a substrate by electroless plating. This process also needs a corrosion step and other complicated steps to form circuit.

Conventional electroless plating on plastics necessarily needs a etching step involving treatment with a solution of sulfuric acid-chromic acid mixture. Moreover, using such a dangerous corrosive liquid in large quantities needs measures for environmental protection. Therefore, it cannot be practiced by manufacturers without waste disposal facilities and it needs additional cost for such waste disposal.

Special resin grades for electroless plating have been developed on various plastics. They are modified to make etching easier for improving adhesion between the substrate (plastics) and the plating layer. Such modification, however, partly sacrifices the inherent characteristics of the plastics and also raises the price of the plastics.

In order to solve the above-mentioned problems, there has been developed a process for performing electroless plating without etching on the substrate surface, as disclosed in Japanese Patent Publication No. 33461/1994. This process entails a step of forming a coating film of chitosan or a derivative thereof on the substrate. The disadvantage of this process is that the plating film does not firmly adhere to the substrate and hence needs prime coating to improve adhesion. In fact, the above-cited invention gives an example of using an acrylic-based primer coating but does not give any examples without primer coating.

There are not any other electroless plating processes than mentioned above which do not need a etching step or a coating material filled with palladium (Pd) fine particles as a catalyst, except for that invented by the present inventors mentioned later.

The present inventors have investigated the composition of the resin for coating film and applied for five patents for it. (Japanese Patent Laid-open Nos. 64481/1991, 103771/1992, and 302214/1996; Japanese Patent Publication No. 622531/1995; and Japanese Patent Application No. 256003/1997.)

The Patent Application No. 256003/1997, which is not yet opened, discloses a resin composition for electroless plating and a process for electroless plating using this resin composition. The resin composition is characterized by having in combination (A) a chemical structure with at least one kind of nitrogen-hydrogen bond selected from the group consisting of amino group, imino group, amide linkage, urethane linkage, urea linkage, secondary amine structure, and melamine structure, and (B) a salt-forming functional group. The process consists of applying the above-mentioned resin composition onto an adhesive, non-conductive substrate, thereby forming a coating film thereon, adding a catalyst, and activating the catalyst.

The present inventors' inventions are all designed to perform electroless plating after forming a coating film of resin on the substrate. They premise the use of a new catalyst for electroless plating on plastics such as ABS. This catalyst is a complex salt of $PdCl_2$ and $SnCl_2$, with the Pd-containing complex ion being anionic. It permits Pd to adhere easily to a plastic to which Pd does not easily adhere from a simple Pd cationic solution. In addition, it is readily reduced.

The process disclosed in Japanese Patent Application No. 256003/1997 mentioned above is intended to utilize the chemical structure which permits the anionic complex ion to adhere easily. The disadvantage of this process is that plating film is deposited on also uncoated areas unless the substrate is thoroughly rinsed after dipping in the catalyst solution. Therefore, this process presents extreme difficulties in industrially performing electroless plating for electromagnetic wave shielding only on the inside or producing printed circuit boards by full-additive process that employs electroless plating. The latter is almost impossible. In other words, the disclosed process does not match the requirement that the coating film of electroless plating be deposited only on the surface which is coated with a resin composition.

In their investigation into a new process which needs no etching step and permits partial plating, the present inventors tried the dipping of a coating film of the resin composition disclosed in the above-mentioned patent application in a solution of $PdCl_2$ in place of Pd catalyst of the above-mentioned complex salt in the catalyst imparting step. The solution of $PdCl_2$ does not adhere readily to ordinary plastics. As a result, it was found that there exists a coating film of resin composition that attracts Pd cations, thereby permitting partial electroless plating. The present inventors further studied the relationship between the capability of partial electroless plating and the chemical structure possessed by the resin composition. It was empirically found that Pd cations adhere to the coating film of a resin composition if the resin composition is composed of a base having the nitrogen-hydrogen bond and a compound with a salt-forming functional group, with the latter being a polybasic acid having a carbon—carbon double bond.

The present inventors assumed that the adhesion of Pd cations is due to ion exchange reaction. This assumption was made based on the fact that the coating film of the resin composition is dipped in a solution of neutral detergent and sodium carbonate in the degreasing step so that the acid radical in the coating film is converted into an Na-salt and then dipped in a $PdCl_2$ solution in the subsequent catalyst imparting step, in which Pd cations are ion-bonded to the acid radical through ion exchange. In reality, however, such cation exchange should not occur under the strong acidic condition according to common sense of ion exchange reaction because the $PdCl_2$ solution is kept acidic with hydrochloric acid for its stability. Nevertheless, Pd does adhere to the coating film of the resin composition.

About the phenomenon mentioned above, the present inventors formulated a hypothesis as follows. That is, basic bond (or the nitrogen—hydrogen bond) in the coating film of the resin composition degreased and cleaned in weak alkali condition, is bound with $OH^-$, and polybasic acid which is another ingredient of the resin composition has double bonds in the main chain consisted of carbon atoms, therefore when the degreased and cleaned film dipped in $PdCl_2$ solution, neutralization and ion-exchange simultaneously take place in a local region in the molecule, then $Cl^-$ in $PdCl_2$ solution are adsorbed to basic bond through ion-exchange. The electron of $Cl^-$ push π-electron of the adjoining double bond of polybasic acid out to the next double bond, and then π-electron of the electron accepted double bond is pushed out to next double bond. Such a phenomenon of pushing out π-electron as lined dominos are pushed down one after another by a pushing the first one, is repeated until terminal acid radical of the molecule. Thus un-ionizable weak acid radicals in strong acidic condition, such as carboxyl radical, are ionized, and by these ionized acid radicals, the activated coating film adsorbed Pd cations through ion-exchange. (After this, above mentioned degreasing and cleaning step in weak alkali condition is called activating step.)

The present inventors further contemplated how to prove the hypothesis from the chemical structure of the coating film of the resin composition. Results of series of experiments indicate that double bonds are not necessary in the case of mutual reaction for curing in combination one polymer such as polyethyleneimine or butylated melamine which is dense with basic bonds or nitrogen—hydrogen bonds, with the other polymer which has a low-molecular weight polybasic acid compatible with said polymer. Presumably, this is because the basic bond (or nitrogen—hydrogen bond) comes so close to the acid radical that negative charges are easily transmitted.

SUMMARY OF THE INVENTION

The present invention came from the above-mentioned technical background. It is an object of the present invention to provide a process for partial electroless plating which, without requiring the etching step, causes the electroless plating film to deposit only on a part of plastics substrate which needs electroless plating.

That is, the gist of the present invention resides in a process for electroless plating including five steps of forming a coating film on which electroless plating is performed, activating said coating film, imparting a catalyst to said coating film, activating said catalyst, and performing electroless plating, characterized in that said coating film is formed from any one of the following four resin compositions.

1. A resin composition composed of a low-molecular weight compound having a basic bond, an adhesive polymer which has carbon—carbon double bonds in the main chain, and a polybasic acid having a carbon—carbon double bond.

2. A resin composition composed of an adhesive polymer dense with basic bonds, and a low-molecular weight polybasic acid compatible with said polymer or a monobasic acid having a carbon—carbon double bond.

3. A resin composition composed of a resin component which gives rise to a basic nitrogen—hydrogen bond upon curing reaction, and a polybasic acid having a carbon—carbon double bond.

4. A resin composition composed of a resin component which gives rise to a basic nitrogen—hydrogen bond upon curing reaction, an adhesive polymer which has a carbon—carbon double bond in the main chain, and a polybasic acid having a carbon—carbon double bond.

The above-mentioned five steps are separated by rinsing. According to the present invention, the process for electroless plating does not need a etching step. The steps of the process are explained below individually.

The first step is to form a coating film on which electroless plating is performed. This coating film is formed from a coating solution containing any one of the above-mentioned four resin compositions as a non-volatile matter. Upon coating and drying or curing, the coating solution gives a water-insoluble coating film of amphoteric resin composition.

The second step is to activate the coating film. In this step, the coating film formed in the first step is treated with a weak alkaline solution containing a neutral detergent so that acid radical or acid anhydride in the coating film is changed into an alkali metal salt.

The third step is to impart a catalyst to the coating film. In this step, the coating film activated in the second step is treated with a acidic solution containing Pd ions so that Pd ions are adsorbed to the coating film.

The fourth step is to activate the catalyst. In this step, the coating film which has been given Pd ions in the third step is treated with a reducing solution so that the Pd ions are reduced into metallic Pd effective for electroless plating.

The fifth step is to perform electroless plating. In this step, the coating film carrying metallic Pd is treated with an electroless plating solution so that metal plating film is deposited on the coating film.

DETAILED DESCRIPTION OF THE PREFERRED EMBODIMENT

It is essential for the present invention that the coating film of resin composition, which is partially formed on a substrate to be plated as desired in the first step, should have a specific chemical structure, which is within the scope of the invention for which the present inventors previously filed a patent application (Japanese Patent Application 256003/1998). The coating film has a chemical structure which permits ion exchange of Pd cations in a strong acidic solution as mentioned above.

This chemical structure is characterized by the main chain having a carbon—carbon double bond, for example, that of aliphatic polymers (e.g., 1,4-butadiene polymer and isoprene polymer) and derivatives thereof and aromatic polymers and derivatives thereof. (Note that the benzene nucleus has carbon—carbon double bonds.)

The adhesive polymer dense with basic bonds, which can be combined with a (low-molecular weight) polybasic acid free of double bonds, may be exemplified by polyethyleneimine, alkylated melamine, and alkylated urea. Melamine includes benzoguanamine which is similar to melamine in chemical structure.

The point of the present invention lies not in the resin composition for the coating film but in the process of partial electroless plating which does not need the etching step. This process consists of activating the coating film of the resin composition and providing only the coated area with Pd cations by contact with the acidic solution. It was believed that Pd cations do not easily adsorb to plastics.

The resin composition, from which the coating film for electroless plating is formed in the first step, should contain a component capable of film forming and adhesion to the substrate to be plated. This component may be any component of resin composition for paints and adhesives. It may be adequately supplemented by the chemical structure that permits partial electroless plating. This chemical structure includes the nitrogen—hydrogen bond, the main chain having a carbon—carbon double bond, and the polybasic acid base.

The component, which has both film-forming properties and adhesion properties, includes, for example, the following polymers. Polybutadiene polyol, unsaturated aliphatic polyester, and drying oil-modified alkyd resin which are used for coating materials. Aromatic polyesters and epoxy resins (which are used as adhesives). Thermoplastic phenolic resin (novolak), ethyleneimine having a basic (nitrogen—hydrogen) bond, alkylated melamine, and alkylated urea (which are used as tackifiers).

The basic chemical structure or the nitrogen—hydrogen bond includes, for example, the following structures. Basic functional radicals such as imino group and amino group, melamine structure, urea structure, urethane linkage used as crosslinking structure for paints and adhesives, and the secondary amine structure which is formed in amine-cured epoxy resins.

The coating film may contain imino groups or amino groups or has the melamine structure or urea structure if the adhesive film-forming component is combined with a basic low-molecular weight compound such as aminophenol and imidazole, or if the coating film itself is formed from a polymer such as polyethyleneimine, alkylated melamine, alkylated urea, and polyaminopolymer which originally has the basic chemical structure nitrogen—hydrogen bond.

The polymer with a basic bond possesses both film-forming properties and adhesive properties. However, it is not used as such if it is water-soluble like polyethyleneimine. It should be made water-insoluble. This is accomplished by heating the coating film at 110 to 150° C. for 30 minutes (varying depending on the polybasic acid component contained therein) in the case of polyethyleneimine, or by curing with an epoxy group-containing monomer or polymer in the case of polyaminopolymer.

The coating film may have the melamine structure or urea structure if it is formed from an alkylated (usually butylated) polymer or co-condensation polymer thereof alone or in combination with a polyol polymer or a polyepoxy polymer. The alkylated polymer is obtained by converting amino groups partly into methylol groups and then etherifying them with an alcohol. The polymer is incorporated with a polybasic acid component, and the resulting mixture is made into the coating material. After application, the coating material is cured at 120 to 140° C. for 20 to 40 minutes. The curing temperature may be lowered to 80–100° C. if the coating material is incorporated with 1 to 2% of p-toluenesulfonic acid as a cure accelerator. This will be discussed later in the section of Example.

"The main chain having a carbon—carbon double bond" is a condition required of both the above-mentioned adhesive film-forming component and the acid component mentioned later as an essential component of the present invention. Polybasic acids meeting this condition include, for example, maleic acid, fumaric acid, itaconic acid, 1,4-polybutadiene modified with maleic acid, and hydroxyethyl acrylate monophosphate ester. Monobasic acids meeting this condition include, for example, p-toluenesulfonic acid and thiosalicylic acid. Polybasic acids having no double bonds which can be used for the adhesive polymer with the chemical structure dense with basic bonds include those of low-molecular weight, such as malic acid, monoethylphosphate, hypophosphorous acid, phosphoric acid, and boric acid.

The coating film is formed from the resin composition of specific chemical structure as mentioned above. However, not all the coating films permit the electroless plating. The result depends on the miscibility, reactivity, and adhesion properties of the individual components of the resin composition.

The individual steps in the present invention will be explained below.

The first step is to form a coating film from a coating material. This coating material contains a resin composition that gives rise to a coating film on which electroless plating can be performed. The coating film is formed on that part of a substrate which is to be plated. After application, the coating film is cured. The partial application may be accomplished by any known method, such as spraying through a mask, drawing with a dispenser, or screen printing.

The second step is to activate the coating film. Activation is accomplished such that the base contained in the coating film formed and cured in the first step is made to combine with OH⁻ and the acid radical or the polybasic acid anhydride is made an alkali salt. This step is preliminary to the third step in which Pd ions are adsorbed to the coating film through ion exchange reaction. To achieve the object, the coating film is treated for degreasing and cleaning with a solution containing a neutral detergent and a weak alkali salt such as sodium carbonate. This treating solution may be any degreasing detergent commonly used for electroless plating on plastics. The solution concentration, the solution temperature, and the duration of treatment may be experimentally established according to the alkali resistance of the coating film. They are typically about 5%, 45 to 55° C., and 4 to 5 minutes. The solution temperature and treating time should be reduced for the coating film with low alkali resistance.

The third step is to impart a catalyst to the coating film. In this step, the coating film is treated with an acidic solution containing Pd ions so that Pd is adsorbed to the surface of the coating film through ion exchange with the alkali salt formed from the acid radical in the second step for activation. (It is supposed that Na ion adsorbed to acid radical in the second step is exchanged for Pd ion.) It is considered that Pd ions are accumulated in layers on top of the other which has been previously deposited by ion exchange. An example of the acidic solution containing Pd ions is a solution of $PdCl_2$. A $PdCl_2$ solution stabilized with hydrochloric acid is commercially available as a catalyst for electroless plating.

The fourth step is to activate the catalyst. Activation is accomplished by treating the coating film carrying Pd ions with a reducing solution, so that Pd ions are reduced to metallic Pd effective as a catalyst for electroless plating. It is considered that in this step those Pd atoms connected directly to the acid radical remain unchanged but Pd ions forming layers are reduced and deposited on the surface of said Pd atoms. The reducing agent used in the fourth step includes dimethylaminoborane, sodium hypophosphite, hydrazine and hydrazine compounds, and sodium boron hydride, which are in common use. Of these examples, dimethylaminoborane is particularly desirable.

The fifth step is to perform electroless plating. In this step, the coating film, which carries metallic Pd produced in the third step, is treated with an electroless plating solution. Electroless plating proceeds as follows. Metal ions in the plating solution are reduced by the catalytic effect of metallic Pd and deposited on the surface of Pd. The thus deposited metal autocatalyzes the subsequent metal deposition which forms the plating film. Any common electroless plating solution for electroless copper plating or nickel plating may be used under the ordinary condition.

EMBODIMENTS

The present invention will be described in more detail with reference to the following examples which demonstrate the effect of the electroless plating.

The present invention is based on the above-mentioned hypothesis that Pd cations as a catalyst attach themselves to the coating film through ion exchange reaction which would not ordinarily occur in a strong acid solution. In these examples, the result of electroless plating was evaluated in terms of the ratio of the area covered by electroless plating to the area of the coating film of the resin composition. Electroless plating was rated as satisfactory if the ratio is 100%. For reference, peel strength was measured by the cellophane tape method.

The substrate resins are indicated as follows by the abbreviations prescribed by JIS K-6899-1992 (ISO 1043-1: 1987).

ABS: acrylonitrile-butadiene-styrene copolymer
PC: polycarbonate
PA: polyamide
PPE: polyphenylene ether
PS: polystyrene
PEEK: polyether ether ketone
PI-T: thermoplastic polyimide
PP: polypropylene
EP: epoxy-impregnated glass cloth
PI: polyimide (film)

Table 1 shows the resins used as the substrate in Examples.

TABLE 1

| resin | company | product | description | substance |
|---|---|---|---|---|
| ABS | Mitsui Chemicals | Santakku | UT61 | wide use |
| (PC + ABS) | " | trial manufacture | | PC:ABS = 50:50 |
| (PA + PPE) | Japan GE | GTX | | |
| (PS + PPE) | " | Noriru | 940 | V0 |
| PEEK | Mitsui Chemicals | | | film 50u |
| PI-T | " | Oramu | 450 | no reinforcement |
| PP | " | Mitsui Noblen | NOB795 | for bumper |
| *PP | " | " | NOB795 | PP for bumper coated with primer |
| EP | | | | sheet reinforced by glass fiber |
| PI | KANEKA corp. | Apikal | | film 25u |

1. Procedure for Electroless Plating (1) Test pieces having a coating film of resin composition to be plated were prepared as follows. A 2 to 3 mm thick sheet made from a thermoplastic resin by injection molding or from a thermosetting resin by press molding was cut into squares each measuring 25×70 mm. Each test piece was coated with the coating solution (prepared in each example) by dipping or spraying. Coating was followed by drying or curing under the conditions specified in each example.

(2) The coated test piece underwent electroless plating with the coating solution under the conditions as specified below.

Plating Solution

Film activating agent . . . A degreasing agent composed of sodium carbonate and neutral detergent ("Aceclean A220" from Okuno Seiyaku Co., Ltd.)

Catalyst solution . . . $PdCl_2$ solution acidified with hydrochloric acid ("TMP Activator" from Okuno Seiyaku Co., Ltd.)

Catalyst activator . . . Dimethylaminoborane reducing agent ("OPC 150 Cryster MU" from Okuno Seiyaku Co., Ltd.)

Electroless plating solution . . . ("TMP Chemical Nickel" from Okuno Seiyaku Co., Ltd.)

Plating Conditions

Coating activation (45 to 55° C., 5 min)→Rinsing→Dipping in catalyst solution (normal temperature, 3 min)→Dipping in catalyst activating solution (normal temperature, 5 min)→Rinsing→Dipping in electroless plating nickel solution (40° C., 10 min)→Washing→Drying.

2. Evaluation of Plating Film (1) Ratio of plating film deposition . . . by visual inspection. Simply expressed as "Ratio of deposition" in the tables.

(2) Peel strength . . . tested according to JIS K-5400$^{-1990}$ 8.5 "Paint adhesion test by cross-cut tape method" in the case of molded test pieces. In this test, the plating film is scored to the substrate horizontally and vertically at equal intervals so that 100 squares are formed, by using a prescribed cutter knife. A piece of cellophane tape is applied over the squares and then (1 to 2 minutes later) rapidly removed off, with one end of tape held such that the tape is perpendicular to the plating film. The number of squares remaining on the test piece is counted. In the case of test piece in film form, a piece of cellophane tape is applied to the plate coating and then the cellophane tape and the test piece are separated from each other by holding their ends.

Embodiments 1 and 2

A coating solution was prepared by mixing 5% methanol solutions each containing the following. The mixing ratio is shown in Table 2.

Aminophenol as the low-molecular weight compound having the basic nitrogen—hydrogen bond.

P-tert-butylphenyl novolak as the adhesive polymer having a carbon—carbon double bond in the main chain.

Maleic acid and itaconic acid as the low-molecular weight polybasic acid having a carbon-carbon double bond.

A test piece was formed from a PA+PPE blend which readily adheres to novolak.

The coating solution was applied to the test piece, and electroless plating was carried out in the above-mentioned manner. The results are shown in Table 2. For comparison, the same procedure as above was repeated except that the maleic acid and itaconic acid were replaced by malonic acid and succinic acid (both having no double bonds).

TABLE 2

| embodiment No. | mixing ratio | | | result | |
|---|---|---|---|---|---|
| | aminophenol | p-tert-butylphenol novolak | polybasic acid | ratio of deposition | peel strength (cross-cut method) |
| 1 | o-aminophenol 20 | 30 | maleic acid 50 | 100 | 100/100 |
| 2 | p-aminophenol 20 | 30 | itaconic acid 50 | 100 | 100/100 |
| comparison 1 | o-aminophenol 20 | 30 | malonic acid 50 | 0 | |
| comparison 2 | p-aminophenol 20 | 30 | succinic acid 50 | 0 | |

Embodiment 3

A coating solution was prepared by mixing 5% solutions in a solvent common to all solutes, each containing the following. The mixing ratio is 10:40:50.

Imidazole as the low-molecular weight compound having the basic nitrogen—hydrogen bond.

Polyester adhesive[*1] having hydroxyl groups at both terminals as the adhesive polymer having a carbon—carbon double bond in the main chain.

*1: "Bylon GK130" (polyester copolymer adhesive, MW=5000 to 25000, Tg=10 to 40° C.) from Toyobo Co., Ltd.

Maleic acid-modified 1,4polybutadiene[*2] as the polybasic acid having a carbon—carbon double bond. (abbreviated as "MA-1, 4PB" hereafter)

*2: "AN 4125" (1,4-polybutadiene modified with maleic acid, content of maleic acid=25%, acid value=290) from Nippon Soda Co., Ltd.

Test pieces were formed from (PC+ABS), EP, and PI.

The coating solution was applied to the test pieces, and electroless plating was carried out in the above-mentioned manner. The results are shown in Table 3.

TABLE 3

| | | peel strength | |
|---|---|---|---|
| resin | ratio of deposition % | cross-cut method | cellophane tape peeling method |
| (PC + ABS) | 100 | 100/100 | |
| EP | 100 | 100/100 | |
| PI | 100 | | not peel |

Embodiments 4 to 9

A coating solution was prepared by mixing 5% methanol solutions each containing the following. The amount of each component is shown in Table 4.

Polyethyleneimine as the adhesive polymer having the chemical structure dense with basic bonds.[*3]

*3: "Epomine SP1000" (polyethyleneimine, MW=70,000, specific gravity=1.04, amine value=18) from Nippon Shokubai Kagaku Kogyo Co., Ltd.

Malonic acid, maleic acid, hypophosphorous acid, or boric acid as the low-molecular weight polybasic acid compatible with polyethyleneimine.

P-toluenesulfonic acid or thiosalicylic acid as the monobasic acid having a carbon—carbon double bond.

A test piece was prepared from glass fiber-reinforced epoxy resin. The test piece was dipped in the coating solution. Dipping was followed by heating at 150° C. for 30 minutes to make the coating film water-insoluble. The coated test piece underwent electroless plating in the above-mentioned manner. The results are shown in Table 4.

TABLE 4

| embodiment No. | composition of coating solution | | | result | |
|---|---|---|---|---|---|
| | polyethyleneimine | component part of acid | | ratio of deposition (%) | peel strength (cross-cut method) |
| 4 | 75 | malonic acid | 25 | 100 | 100/100 |
| 5 | 75 | maleic acid | 25 | 100 | 100/100 |
| 6 | 65 | p-toluenesulfonic acid | 35 | 100 | 100/100 |
| 7 | 60 | thiosalicylic acid | 40 | 100 | 100/100 |
| 8 | 85 | hypophosphorous acid | 15 | 100 | 100/100 |
| 9 | 15 | boric acid | 15 | 100 | 100/100 |

Embodiments 10 to 20

A coating solution was prepared by mixing 5% solutions in a solvent common to all solutes, each containing the following. The amount of each component is shown in Table 5.

Butylated melamine(*4 and 5) or butylated urea(*6) as the adhesive polymer having the chemical structure dense basic bonds.

*4: "Uban 20SE60" (butylated melamine standard grade, acid value <1, non-volatile matter=60%, viscosity (Gardner)=G~N) from Mitsui Chemicals Co., Ltd.
*5: "Uban 91-55" (butylated melamine-benzoguanamine co-condensation resin, acid value <1, non-volatile matter=60%, viscosity (Gardner)=G~N) from Mitsui Chemicals Co., Ltd.
*6: "Uban 10S60" (butylated urea standard grade, acid value <1, non-volatile matter=60%, viscosity(Gardner)=J~O) from Mitsui Chemicals Co., Ltd.

Malonic acid, maleic acid, MA-1,4PB, trimellitic acid, or monoethyl phosphate as the low-molecular weight polybasic acid compatible with the adhesive polymer.

P-toluensulfonic acid or thiosalicylic acid as the monobasic acid having a carbon—carbon double bond.

Each test piece was sprayed with the coating solution. The coating film was cured by heating at 80° C. for 30 minutes. The coated test piece underwent electroless plating in the above-mentioned manner. The results are shown in Table 6.

TABLE 5

| embodiment No | butylated melamine or butylated urea | | component part of acid | | curing accelerator (p-toluenesulfonic acid) |
|---|---|---|---|---|---|
| 10 | butylated melamine (*4) | 10 | malonic acid | 90 | 2 |
| 11 | " | 10 | maleic acid | 90 | 2 |
| 12 | " | 10 | MA-1,4PB | 90 | 2 |
| 13 | " | 20 | p-toluenesulfonic acid | 80 | — |
| 14 | " | 10 | trimellitic acid | 90 | 2 |
| 15 | " | 60 | thiosalicylic acid | 40 | 2 |
| 16 | " | 20 | monoethyl phosphate | 80 | 2 |
| 17 | butylated melamine (*5) | 20 | MA-1,4PB | 80 | 2 |
| 18 | butylated urea (*6) | 20 | MA-1,4PB | 80 | 2 |
| 19 | " | 20 | monoethyl phosphate | 80 | 2 |
| 20 | " | 20 | trimellitic acid | 80 | 2 |

TABLE 6

| embodiment No. | ratio of deposition (%) | peel strength | |
|---|---|---|---|
| | resin | | cross-cut method | cellophane tape peeling method |
| 10 | EP | 100 | 100/100 | |
| 11 | EP | 100 | 100/100 | |
| | PI | 100 | | not peel |
| 12 | EP | 100 | 100/100 | |
| | PI | 100 | | not peel |
| 13 | ABS | 100 | 100/100 | |
| | *PP | 100 | 100/100 | |
| | (PC + ABS) | 100 | 100/100 | |
| | (PA + PPE) | 100 | 100/100 | |
| | PI-T | 100 | 100/100 | |
| 14 | EP | 100 | 100/100 | |
| | PI | 100 | | not peel |
| 15 | EP | 100 | 100/100 | |
| | PI | 100 | | not peel |
| 16 | *PP | 100 | 100/100 | |
| | EP | 100 | 100/100 | |
| 17 | EP | 100 | 100/100 | |
| 18 | EP | 100 | 100/100 | |
| 19 | EP | 100 | 100/100 | |
| 20 | EP | 100 | 100/100 | |

Embodiments 21 to 26

These examples demonstrate that partial electroless plating of nickel can be applied to a coating film formed from a resin composition composed of an adhesive resin having a carbon—carbon double bond in the main chain, butylated melamine for introduction of melamine structure or urea structure, and a polybasic acid component.

In Examples 21 to 23, the resin composition is composed of a polyester adhesive(*7) having a hydroxyl group and carboxyl group at the two terminals (which is used alone as an adhesive), butylated melamine for introduction of melamine structure, and a polybasic acid of different kind.

*7: "Bylon 300" (polyester copolymer adhesive, having terminal —OH group and —COOH radical, MW=5000–25000, acid value=20–60 eq/10 g, hydroxyl value=100–150 eq/10 g) from Toyobo Co., Ltd.

In Examples 24 to 26, the resin composition is composed of an epoxy resin(*8), a drying oil-modified alkyd resin(*9), or a thermosetting acrylic resin(*10) (which are used for paint), butylated melamine for introduction of melamine structure, and p-toluenesulfonic acid.

*8: "Epicoat 828" (epoxy compound, MW=380, epoxy equivalent=184–194) from Shell Chemicals Co., Ltd.
*9: "Hopesol F087" (alkyd resin, non-volatile matter, 708%, viscosity (Gardner)=X) from Kyowa Hakko Kogyo Co., Ltd.
*10: "Dianal #5120" (acrylic resin for paints, acid value=10 to 13, non-volatile matter=50 2%, viscosity (Gardner)=W~Y, specific gravity=0.96 to 0.98) from Mitsubishi Rayon Co., Ltd.

A coating solution was prepared by mixing 5% solutions in a solvent common to the three components. The amount of each component is shown in Table 7. The coating solution was applied by spraying to a test piece of resin. The coating film was cured by heating at 100° C. for 30 minutes. The coated test piece underwent electroless plating in the above-mentioned manner. The results are shown in Table 8.

TABLE 7

| embodiment No. | mixing ratio | | | curing accelerator (p-toluenesulfonic acid) |
|---|---|---|---|---|
| | adhesive resin | butylated melamine | component part of acid | |
| 21 | aromatic polyester(*7) 10 | 20 | MA-1,4PB 70 | 2 |
| 22 | aromatic polyester(*7) 20 | 15 | p-toluenesulfonic acid 65 | — |
| 23 | aromatic polyester(*7) 20 | 15 | monoethyl phosphate 65 | 2 |
| 24 | epoxy resin(*8) 20 | 15 | p-toluenesulfonic acid 65 | — |
| 25 | alkyd resin(*9) 10 | 20 | p-toluenesulfonic acid 70 | — |
| 26 | acrylic resin(*10) 20 | 15 | p-toluenesulfonic acid 65 | — |

TABLE 8

| embodiment No. | ratio of deposition (%) | peel strength | |
|---|---|---|---|
| | resin | | cross-cut method | cellophane tape peeling method |
| 21 | PI | 100 | | not peel |
| | PI-T | 100 | 100/100 | |
| | PEEK | 100 | | not peel |
| 22 | (PA + PPE) | 100 | 100/100 | |
| | PI | 100 | | not peel |
| | PI-T | 100 | 100/100 | |
| | PEEK | 100 | | not peel |
| 23 | PI | 100 | | not peel |
| | PI-T | 100 | 100/100 | |

TABLE 8-continued

| embodiment No. | resin | ratio of deposition (%) | peel strength cross-cut method | peel strength cellophane tape peeling method |
|---|---|---|---|---|
| 24 | PI | 100 | | not peel |
| 25 | PI | 100 | | not peel |
| 26 | PI | 100 | | not peel |

Embodiments 27 to 29

These examples demonstrate the coating film of the resin composition composed of polyurethane which has a urethane linkage as the basic bond formed by reaction between a diisocyanate and a polyol polymer having a double bond and a polybasic acid having a double bond. In Example 27, the polyol polymer is a hot-melt adhesive[*11] of aromatic polyester having a terminal OH group. In Example 28, the polyol polymer is polybutadiene polyol[*12] for urethane paint. In both Examples 27 and 28, the diisocyanate is a curing agent[*13] for urethane paint. In Example 29, urethane-modified aromatic polyol[*14] was used as the adhesive. The polybasic acid having a double bond are MA-1 and 4PB mentioned above.

*11: "Bylon 300" (same as *7 above) from Toyobo Co., Ltd.
*12: "GQ1000" (polyol for urethane paint (boil modified polybutadiene), non-volatile matter=45%, viscosity (Gardner)=F~J, hydroxyl value=45 to 54, acid value=4 to 8).
*13: "Coronate L" (urethane prepolymer, NCO content=12.7 to 13.7%, free TDI content=0.2%, non-volatile matter 74 to 76%, viscosity (Gardner)=W~Y, specific gravity 1.16 to 1.18) from Nippon Polyurethane Industry Co., Ltd.
*14: "Bylon UR3200" (polyester urethane, MW=40,000, Tg=−3° C.) from Toyobo Co., Ltd.

A coating solution was prepared by mixing 5% solutions of the components in thinner for urethane paint. The mixing ratio is shown in Table 9. The curing agent was added immediately before application.

The coating solution was applied to test pieces of plastics. Test pieces in Examples 27 and 28 were baked and cured at 80° C. for 30 minutes. Partial electroless plating was carried out in the above-mentioned manner. The results are shown in Table 10.

TABLE 9

| embodiment No. | mixing ratio curing agent | polyol polymer | MA-1,4PB |
|---|---|---|---|
| 27 | 25(*13) | 20(*11) | 55 |
| 28 | 5(*13) | 10(*12) | 85 |
| 29 | | 40(*14) | 60 |

TABLE 10

| embodiment No. | resin | ratio of deposition (%) | peel strength cross-cut method | peel strength cellophane tape peeling method |
|---|---|---|---|---|
| 27 | ABS | 100 | 100/100 | |
|  | (PC + ABS) | 100 | 100/100 | |
|  | EP | 100 | 100/100 | |
|  | PI | 100 | | not peel |
| 28 | ABS | 100 | 100/100 | |
|  | *PP | 100 | 100/100 | |
| 29 | ABS | 100 | 100/100 | |
|  | (PS + PPE) | 100 | 100/100 | |
|  | (PC + ABS) | 100 | 100/100 | |
|  | (PC + PBT) | 100 | 100/100 | |
|  | EP | 100 | 100/100 | |

Embodiments 30 to 33

These examples demonstrate the coating film of the resin composition composed of a component having the secondary amine structure as the basic bond and a polybasic acid having a double bond. This component is obtained by reaction between a polymer having an amino acid (which is used as a hardener for epoxy resins) and an aromatic polymer or low-molecular weight compound having an epoxy group.

In Example 30, the resin composition is composed of a resin component for paint which is composed of a polymer[*15] having an amino group and sorbitol polyglycidyl ether and MA-1,4PB.

*15: "Kotax LK721" (amino group-containing, epoxy-curable acrylic resin, non-volatile matter=45%, viscosity (Gardner)=Z1, acid value=3.5 1) from Toray Industries Inc.

In Examples 31 and 32, the resin component is an amino-grafted acrylic polymer[*16] for adhesive and epoxy polymer[*17] for general-purpose epoxy resin. In Example 31, the resin component is combined with maleic acid as the polybasic acid having a double bond. In Example 32, the resin component is combined with MA-1,4PB. In Example 33, the resin composition is composed of an amino group-containing polymer[*19] for epoxy adhesive, urethane-modified epoxy polymer[*18], and MA-1,4PB.

*16: "Polyment 350" (acrylic resin with grafted primary amino group, MW=100,000, Tg=40° C., amine hydrogen equivalent=1,100 meq/g solid), from Nippon Shokubai Kagaku Kogyo Co., Ltd.
*17: "Epicoat 828" (see *8 above) from Shell Chemical Co., Ltd.
*18: "Adeca EPU78-11" (urethane-modified epoxy resin, epoxy equivalent= 220 to 240, viscosity=200 to 300 ps/25° C., specific gravity=1.18) from Asahi Denka Kogyo K.K.
*19: "Adecagranmide 645" (condensation product of polymeric fatty acid and polyamine, viscosity=27 ps/25° C., specific gravity=0.97, amine value=380 mgKOH/g, active hydrogen equivalent=100) from Asahi Denka Kogyo K.K.

A coating solution was prepared by mixing 5% solutions in a solvent common to the components used in each example. The mixing ratio is shown in Table 11.

The coating solution was applied to various substrates and then cured under the condition shown in Table 11. Partial electroless plating was carried out in the above-mentioned manner. The results are shown in Table 12.

TABLE 11

| embodiment No. | mixing ratio amino group-containing curing agent | epoxy compound | polybasic acid | curing condition ° C. | curing condition minutes |
|---|---|---|---|---|---|
| 30 | 17.5 (*15) | 7.5 (*15) | MA-1,4PB 75 | 80 | 30 |
| 31 | 27 (*16) | 3 (*17) | maleic acid 100 | 110 | 30 |
| 32 | 9 (*16) | 1 (*17) | MA-1,4PB 100 | 110 | 30 |
| 33 | 10 (*19) | 20 (*18) | MA-1,4PB 70 | room temperature | 30 |

TABLE 12

| embodiment No. | resin | ratio of deposition (%) | peel strength cross-cut method | peel strength cellophane tape peeling method |
|---|---|---|---|---|
| 30 | ABS | 100 | 100/100 | |
| 31 | EP | 100 | 100/100 | |
| | PI | 100 | | not peel |
| 32 | EP | 100 | 100/100 | |
| | PI | 100 | | not peel |
| 33 | (PS + PPE) | 100 | 100/100 | |
| | EP | 100 | 100/100 | |
| | PI | 100 | | not peel |

Effect of the Invention

As mentioned above, the process for partial electroless plating according to the present invention dispenses with the conventional etching step which employs chemicals harmful to environment. It forms plating film only on a part that needs plating. Therefore, it contributes to material saving and energy saving.

The electroless plating of the present invention can be applied to not only general-purpose engineering plastic but also so-called super engineering plastics, such as epoxy resin, polyimide resin, and PEEK, used for printed wiring boards.

In the above-mentioned examples, the coating film was formed from a resin composition containing any of low-molecular weight basic compound, paint and adhesive resin (including urethane, epoxy, and melamine resins), and polyester adhesive (which is used as such for adhesive). These are merely a few examples demonstrating the possibility that a large variety of resin compositions can be used for the coating film on which electroless plating is performed. In other words, the process of electroless plating of the present invention can be applied to a large variety of substrates by preparing a resin composition suitable for individual substrates and specific uses.

What is claimed is:

1. A process for electroless plating including the steps of forming a coating film on which electroless plating is performed, activating said coating film, imparting a catalyst to said coating film, activating said catalyst, and performing electroless plating, characterized in that said coating film is formed from any one of the following four resin compositions:

(1) a resin composition composed of a compound having a basic bond, an adhesive polymer which has a carbon—carbon double bond in the main chain, and a polybasic acid having a carbon—carbon double bond;

(2) a resin composition composed of an adhesive polymer dense with basic bonds, and a polybasic acid compatible with said polymer or a monobasic acid having a carbon—carbon double bond;

(3) a resin composition composed of a resin component which gives rise to a basic nitrogen—hydrogen bond upon curing reaction, and a polybasic acid having a carbon—carbon double bond; and (4) a resin composition composed of a resin component which gives rise to a basic nitrogen—hydrogen bond upon curing reaction, an adhesive polymer which has a carbon—carbon double bond in the main chain, and a polybasic acid having a carbon—carbon double bond, the said step of forming a coating film is consisted of preparing a solution of any one of the four resin compositions (1), (2), (3), and (4), applying the solution to a substrate, and drying or curing the coated solution, thereby forming a water-insoluble film of amphoteric resin composition, the said step of activating the coating film is consisted of treating the cured film with a weak alkaline solution containing a neutral detergent, thereby converting acid radical or acid anhydride in the coating film into an alkali metal salt, and the said step of imparting a catalyst to the coating film consists of treating the activated coating film with an acidic solution containing Pd ions, thereby causing Pd ions to be absorbed to the coating film.

2. A process for electroless plating as defined in claim 1, wherein the step of activating the catalyst consists of treating the coating film carrying Pd ions with a reducing solution, thereby reducing Pd ions into metallic Pd effective for electroless plating.

3. A process for electroless plating as defined in claim 1, wherein the step of performing electroless plating consists of treating the coating film carrying metallic Pd with an electroless plating solution, thereby causing metal plating film to deposit on the coating film.

* * * * *